United States Patent
Lhee

(10) Patent No.: US 9,570,529 B2
(45) Date of Patent: Feb. 14, 2017

(54) ORGANIC LIGHT EMITTING DIODE DISPLAY

(75) Inventor: Zail Lhee, Yongin (KR)

(73) Assignee: SAMSUNG DISPLAY CO., LTD., Yongin, Gyeonggi-Do (KR)

(*) Notice: Subject to any disclaimer, the term of this patent is extended or adjusted under 35 U.S.C. 154(b) by 652 days.

(21) Appl. No.: 13/067,066

(22) Filed: May 5, 2011

(65) Prior Publication Data
US 2011/0272714 A1 Nov. 10, 2011

(30) Foreign Application Priority Data
May 6, 2010 (KR) .................. 10-2010-0042594

(51) Int. Cl.
H01L 27/32 (2006.01)
H01L 51/52 (2006.01)

(52) U.S. Cl.
CPC ....... H01L 27/3276 (2013.01); H01L 51/5246 (2013.01)

(58) Field of Classification Search
CPC .................. H01L 27/3276; H01L 51/5246
USPC .... 257/88, E51.018, 81, 91; 438/25, 34, 28, 438/26
See application file for complete search history.

(56) References Cited

U.S. PATENT DOCUMENTS

| | | | |
|---|---|---|---|
| 6,549,259 B2* | 4/2003 | Sato et al. | 349/153 |
| 6,862,069 B2* | 3/2005 | Kwak et al. | 349/143 |
| 2003/0094615 A1* | 5/2003 | Yamazaki | H01L 27/12 257/72 |
| 2006/0181221 A1* | 8/2006 | Sato | 315/169.3 |
| 2007/0126969 A1* | 6/2007 | Kimura | G02F 1/134363 349/141 |
| 2007/0132382 A1* | 6/2007 | Lee et al. | 313/512 |
| 2009/0066655 A1* | 3/2009 | Kim et al. | 345/169 |

FOREIGN PATENT DOCUMENTS

| | | |
|---|---|---|
| JP | 2004-030974 | 1/2004 |
| KR | 10-2005-0090259 A | 9/2005 |
| KR | 10-2006-0050699 A | 5/2006 |
| KR | 1020050090259 A * | 8/2006 |
| KR | 10-0863968 B1 | 10/2008 |

OTHER PUBLICATIONS

Machine translation of KR1020050090259 (translated Nov. 25, 2013).*
Machine translation of KR 1020050090259.*

* cited by examiner

*Primary Examiner* — Zandra Smith
*Assistant Examiner* — Lauren R Bell
(74) *Attorney, Agent, or Firm* — Lee & Morse, P.C.

(57) ABSTRACT

An organic light emitting diode (OLED) display including a display substrate; a sealing member facing the display substrate; a sealant between the display substrate and the sealing member, the sealant cohering the display substrate and the sealing member; a plurality of conductive wires on the display substrate and overlapping the sealant; and a heat blocking film between the conductive wire and the sealant, the heat blocking film including a plurality of sub-heat blocking films.

17 Claims, 6 Drawing Sheets

100 # ORGANIC LIGHT EMITTING DIODE DISPLAY

BACKGROUND

1. Field

Embodiments relate to an organic light emitting diode (OLED) display.

2. Description of the Related Art

In general, an organic light emitting diode (OLED) display includes a display substrate that has an organic light emitting diode, a sealing member that is disposed so as to face the display substrate, thereby protecting the organic light emitting diode of the display, and a sealant that coheres or adheres the display substrate and the sealing member and seals them. The sealant may adhere and seal the display substrate and the sealing member by irradiating a laser thereon to cure the sealant.

In the organic light emitting diode (OLED) display, a plurality of conductive wires may overlap the sealant on the display substrate. When the sealant is cured by irradiating with the laser, the conductive wire may be melted by the laser and a short circuit may occur between the conductive wires. In order to prevent this, the conductive wire may include a heat blocking film including a material that is resistant to heat, e.g. silver (Ag) between the conductive wire and the sealant.

The above information disclosed in this Background section is only for enhancement of understanding of the background of the described technology and therefore it may contain information that does not form the prior art that is already known in this country to a person of ordinary skill in the art.

SUMMARY

Embodiments are directed to an organic light emitting diode (OLED) display, which represents advances over the related art.

It is a feature of an embodiment to provide an organic light emitting diode (OLED) display having advantages of improving durability of the conductive wire that overlaps the sealant and suppresses the occurrence of defects.

At least one of the above and other features and advantages may be realized by providing an organic light emitting diode (OLED) display including a display substrate; a sealing member facing the display substrate; a sealant between the display substrate and the sealing member, the sealant cohering the display substrate and the sealing member; a plurality of conductive wires on the display substrate and overlapping the sealant; and a heat blocking film between the conductive wire and the sealant, the heat blocking film including a plurality of sub-heat blocking films.

The sub-heat blocking films may cover at least portions of the conductive wire.

The sub-heat blocking films may be spaced apart along a width direction of the sealant.

The sub-heat blocking films may have a triple film structure including silver (Ag) or ITO/Ag/ITO.

The organic light emitting diode (OLED) display may further include at least one short circuit blocking film between the plurality of conductive wires.

The short circuit blocking film may overlap the sealant.

The organic light emitting diode (OLED) display may further include a plurality of the short circuit blocking films disposed along a length direction of the sealant.

Each short circuit blocking film may have a planar rectangular shape.

Each short circuit blocking film may include a plurality of sub-short circuit blocking films spaced apart from one another along a width direction of the sealant.

The sub-short circuit blocking films may have a planar quadrangle shape.

The organic light emitting diode (OLED) display may further include a thin film transistor in a display area of the display substrate, and a driving circuit chip at an edge of the display substrate, the driving circuit chip transferring a driving signal to the thin film transistor, wherein at least one of the conductive wires electrically connects the thin film transistor and the driving circuit chip.

The organic light emitting diode (OLED) display may further include an organic light emitting diode, organic light emitting diode including a first electrode on the thin film transistor, an organic emission layer on the first electrode, and a second electrode on the organic emission layer.

The short circuit blocking film may have a double film structure that includes a lower blocking film and an upper blocking film.

The upper blocking film may cover the lower blocking film.

The conductive wires may include at least one of aluminum (Al), chromium (Cr), molybdenum (Mo), titanium (Ti), tantalum (Ta), Al—Ni—La alloy, and Al—Nd alloy.

The lower blocking film may be formed of a same material as the conductive wire.

The upper blocking film may be formed of the same material as the first electrode.

The short circuit blocking film may have a single film structure.

The single film short circuit blocking film may be formed of the same material as the first electrode.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
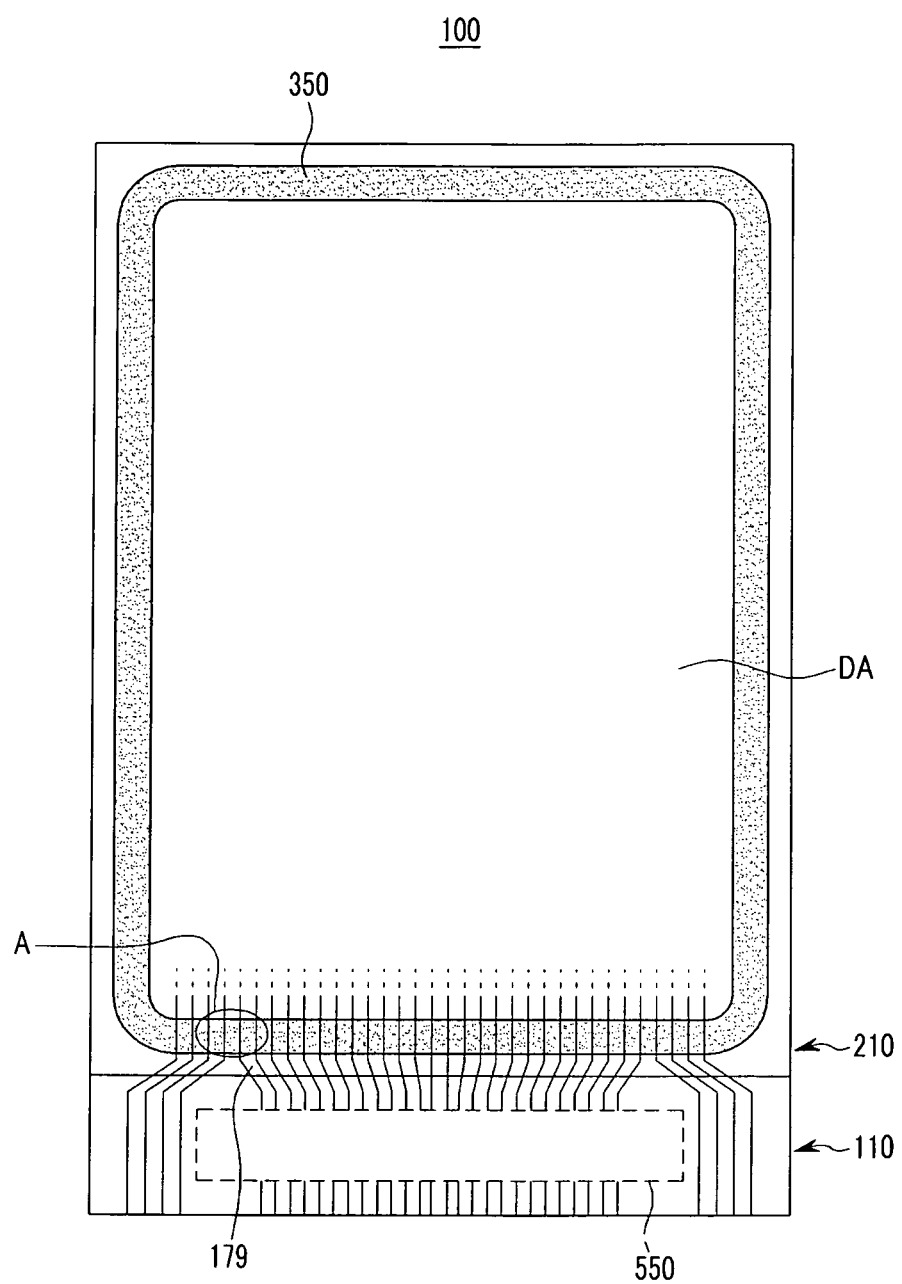
FIG. 1 illustrates a top plan view of an organic light emitting diode (OLED) display according to an embodiment.

Korean Patent Application No. 10-2010-0042594,, filed on May 6, 2010, in the Korean Intellectual Property Office, and entitled: "Organic Light Emitting Diode Display," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

In addition, in the accompanying drawing, an active matrix (AM) type organic light emitting diode (OLED) display that has a 2Tr-1Cap structure which includes one pixel, two thin film transistors (TFT), and one capacitor element (capacitor plate) is shown, but the embodiments are not limited thereto. Accordingly, the organic light emitting diode (OLED) display may be provided with three or more thin film transistors and two or more capacitor elements for one pixel, and a separate wire may be further formed to provide various structures. Here, the pixel means a minimum unit that displays an image, and the organic light emitting diode (OLED) display displays an image through a plurality of pixels.

Hereinafter, referring to FIGS. 1 to 3, an organic light emitting diode (OLED) display according to an embodiment will be described.

FIG. 1 illustrates a top plan view of an organic light emitting diode (OLED) display according to an embodiment. FIG. 2 illustrates a layout view of a portion of a display area of FIG. 1. FIG. 3 illustrates a cross-sectional view taken along the line III-III of FIG. 2.

As shown in FIG. 1, an organic light emitting diode (OLED) display 100 according to the present embodiment may include a display substrate 110, a sealing member 210 that covers the display substrate 110, and a sealant 350 between the display substrate 110 and the sealing member 210.

The sealant 350 may be disposed along an edge of the sealing member 210. The sealant 350 may cohere or adhere the display substrate 110 and sealing member 210 together and may seal them. Hereinafter an internal side between the display substrate 110 that is surrounded by the sealant 350 and the sealing member 210 is referred to as the display area (DA). In the display area (DA), a plurality of pixels may be formed, thus forming an image.

The sealing member 210 may have a smaller size than the display substrate 110. In addition, a driving circuit chip 550 may be mounted on an edge of a side of the display substrate 110 that is not covered by the sealing member 210.

A plurality of conductive wires 179 that electrically connect elements in the DA and the driving circuit chip 500 may be formed at the edge of the display substrate 110. The conductive wire 179 may partially overlap the sealant 350, i.e., may be between the sealant 350 and the display substrate 110.

Figure 2:
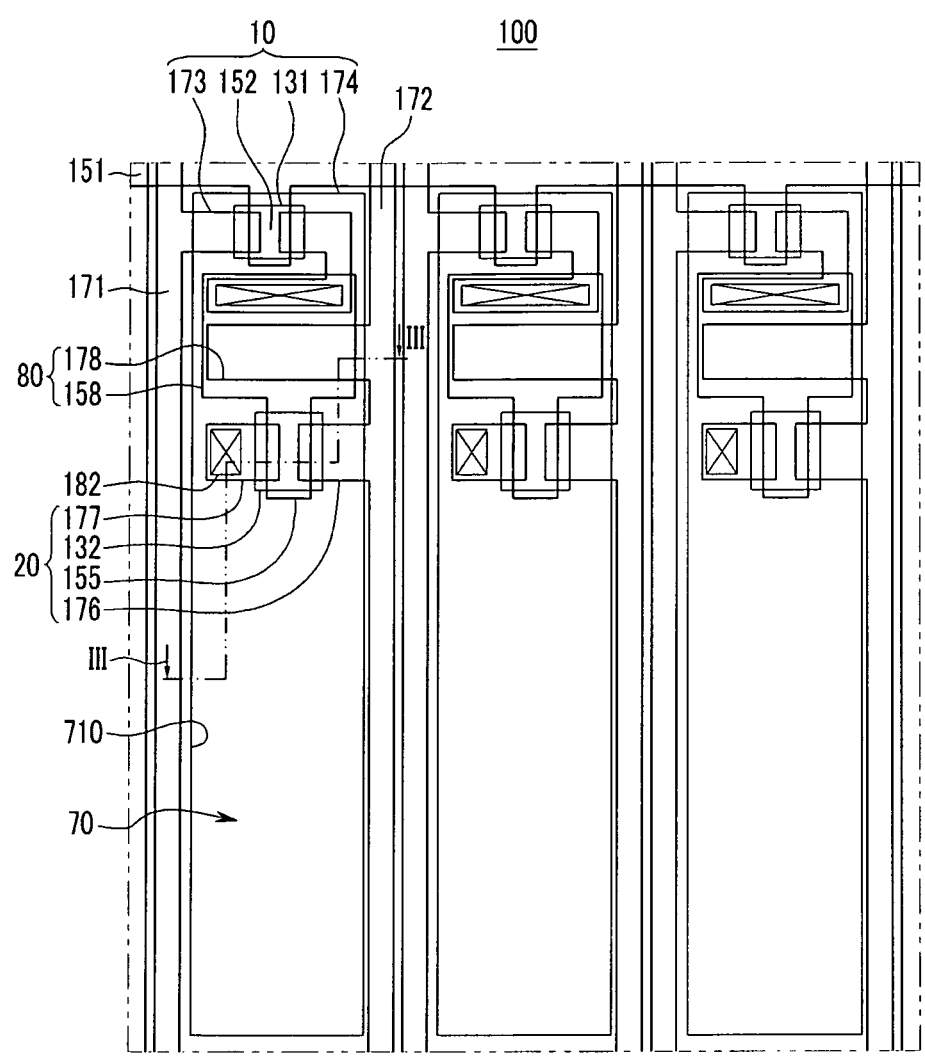
FIG. 2 illustrates a layout view of a portion of a display area of FIG. 1.
Figure 3:
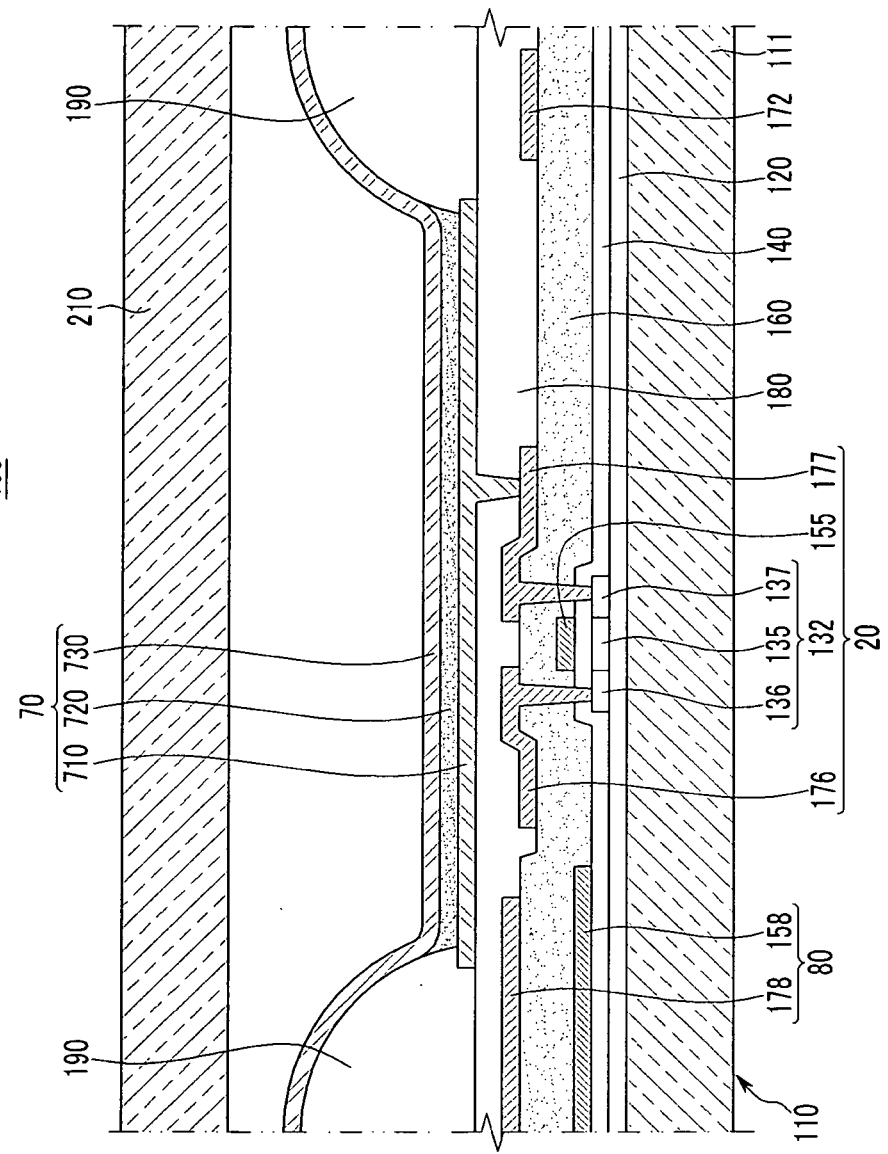
FIG. 3 illustrates a cross-sectional view taken along the line of FIG. 2.

Referring to FIGS. 2 and 3, an internal structure of the organic light emitting diode (OLED) display 100 will be described with respect to the pixel on the display area (DA).

As shown in FIG. 2, the display substrate 110 may include a switching thin film transistor 10, a driving thin film transistor 20, a capacitor element 80, and an organic light emitting diode (OLED) 70 for each pixel. In addition, the display substrate 110 may further include a gate line 151 disposed along a predetermined direction and data line 171 and common electric power line 172 that are insulated from and cross the gate line 151. One pixel may be defined by the gate line 151, data line 171, and common electric power line 172 as a boundary thereof, but it is not limited thereto.

The organic light emitting diode 70 may include a first electrode 710, a organic emission layer 720 (shown in FIG. 3) on the first electrode 710, and a second electrode 730 (shown in FIG. 3) on the first organic emission layer 720. Herein, the first electrode 710 may be an anode (+) that is a hole injection electrode and the second electrode 730 may be a cathode that is an electron injection electrode. However, the embodiments are not limited thereto, and the first electrode 710 may be the cathode and the second electrode 730 may be the anode according to a driving method of the organic light emitting diode (OLED) display 100. Holes and electrons may be injected into the organic emission layer 720 from the first electrode 710 and the second electrode 730. When excitons in which the injected holes are combined with the electron fall from an exited state to a ground state, light is emitted.

The capacitor element 80 may include a first capacitor plate 158 and a second capacitor plate 178 disposed on opposite sides of an interlayer insulating layer 160. Thus, the interlayer insulating layer 160 may be a dielectric material. Capacitance is determined by a charge that is accumulated in the capacitor element 80 and a voltage between the first and second capacitor plates 158 and 178.

The switching thin film transistor 10 may include a switching semiconductor layer 131, a switching gate electrode 152, a switching source electrode 173, and a switching drain electrode 174. The driving thin film transistor 20 may include a driving semiconductor layer 132, a driving gate electrode 155, a driving source electrode 176, and a driving drain electrode 177.

The switching thin film transistor 10 may be a switching element that selects the pixel that emits light. The switching gate electrode 152 may be connected to the gate line 151. The switching source electrode 173 may be connected to the data line 171. The switching drain electrode 174 may be separated from the switching source electrode 173 and may be connected to the first capacitor plate 158.

The driving thin film transistor 20 may apply a driving power for emitting light of the organic emission layer 720 of the organic light emitting diode 70 in a selected pixel to the first electrode 710. The driving gate electrode 155 may be connected to the first capacitor plate 158. The driving source electrode 176 and the second capacitor plate 178 may each be connected to the common power line 172. The driving drain electrode 177 may be connected to the first electrode 710 of the organic light emitting diode 70 through the electrode contact hole 182.

By the above structure, the switching thin film transistor 10 may be operated by a gate voltage that is applied to the gate line 151 and may transfer a data voltage that is applied to the data line 171 to the driving thin film transistor 20. A voltage that corresponds to a difference in a common voltage that is applied from the common power line 172 to the driving thin film transistor 20 and the data voltage that is transferred from the switching thin film transistor 10 may be stored in the capacitor element 80. Current that corresponds to the voltage that is stored in the capacitor element 80 may flow through the driving thin film transistor 20 to the organic light emitting diode 70 to allow the organic light emitting diode 70 to emit light.

Referring to FIG. 3, a structure of an organic light emitting diode (OLED) display according to the present embodiment will be described in detail with respect to a layering order.

Hereinafter, a structure of the thin film transistor will be described with the driving thin film transistor 20. The switching thin film transistor 10 will be described briefly with respect to a difference to the driving thin film transistor.

First, the display substrate 110 will be described. A first substrate member 111 may be formed of an insulating substrate made of e.g., glass, quartz, ceramic, plastic, and the like. However, the embodiments are not limited thereto. Accordingly, the first substrate member 111 may be formed of, e.g., a metal substrate that is made of stainless steel and the like.

A buffer layer 120 may be formed on the first substrate member 111. The buffer layer 120 may prevent impure elements from permeating and may planarize the surface. The buffer layer 120 may be formed of various suitable materials that are able to perform these functions. For example, the buffer layer 120 may include any one of silicon nitride ($SiN_x$) film, silicon oxide $SiO_2$, film, and silicon nitroxide ($SiO_xN_y$) film. In an implementation, the buffer layer 120 may be omitted according to the kind and the process condition of the first substrate member 111.

A driving semiconductor layer 132 may be formed on the buffer layer 120. The driving semiconductor layer 132 may be formed of, e.g., polysilicon film. In addition, the driving semiconductor layer 132 may include a channel region 135 in which an impurity is not doped and a source region 136 and a drain region 137 that are p+ doped at both ends of the channel region 135. The doped ion material may include a p type impurity, e.g., boron (B) and/or $B_2H_6$. This impurity may vary according to the kind of the thin film transistor.

In the present embodiment, the thin film transistor that has the PMOS structure including the p type impurity may be used as the driving thin film transistor 20, but is not limited thereto. Therefore a, e.g., NMOS structure or CMOS structure thin film transistor, may be used as the driving thin film transistor 20.

In addition, as shown in FIG. 2, the driving thin film transistor 20 may be a polysilicon thin film transistor that includes a polysilicon film. The switching thin film transistor 10 (not illustrated in FIG. 2), may be, e.g., a polysilicon thin film transistor or amorphous thin film transistor that includes an amorphous silicon film.

A gate insulating layer 140 including, e.g., silicon nitride ($SiN_x$) or silicon oxide $SiO_2$, may be formed on the driving semiconductor layer 132. The gate wire including the driving gate electrode 155 may be formed on the gate insulating layer 140. In addition, the gate wire may further include a gate line 151, the first capacitor plate 158, and another wire. In addition, the driving gate electrode 155 may be formed so as to overlap at least a portion of the driving semiconductor layer 132, particularly the channel region 135.

The interlayer insulating layer 160 may be formed on the gate insulating layer 140 to cover the driving gate electrode 155. The gate insulating layer 140 and the interlayer insulating layer 160 may have through-holes that expose the source region 136 and drain region 137 of the driving semiconductor layer 132. The interlayer insulating layer 160, like the gate insulating layer 140, may include a ceramic-based material, e.g., silicon nitride ($SiN_x$) and/or silicon oxide $SiO_2$.

The data wire including the driving source electrode 176 and driving drain electrode 177 may be formed on the interlayer insulating layer 160. In addition, the data wire may further include a data line 171, a common power line 172, the second capacitor plate 178, and another wire. In addition, the driving source electrode 176 and driving drain electrode 177 may be connected to the source region 136 and drain region 137 of the driving semiconductor layer 132 through the through-holes in the interlayer insulating layer 160 and gate insulating layer 140.

As described above, the driving thin film transistor 20 that includes the driving semiconductor layer 132, driving gate electrode 155, driving source electrode 176, and driving drain electrode 177 may be formed. The driving thin film transistor 20 is not limited the above examples, and may be variously modified by those who are skilled in the art.

A planarization layer 180 that covers the data wires 172, 176, 177, and 178 may be formed on the interlayer insulating layer 160. The planarization layer 180 may remove a step and may planarize in order to increase luminous efficiency of the organic light emitting diode 70 to be formed thereon. In addition, the planarization layer 180 may have an electrode contact hole 182 that exposes a portion of the drain electrode 177.

The planarization layer 180 may include at least one of, e.g., acryl resin (such as polyacrylate resin), epoxy resin, phenolic resin, polyamide resin, polyimide rein, unsaturated polyester resin, polyphenylenether resin, polyphenylenesulfide resin, and benzocyclobutene (BCB).

The embodiments are not limited to the above structures and, if desired, any one of the planarization layer 180 and the interlayer insulating layer 160 may be omitted.

The first electrode 710 of the organic light emitting diode 70 may be formed on the planarization layer 180. In particular, the organic light emitting diode (OLED) display 100 may include a plurality of first electrodes 710 for a plurality of pixels. The plurality of the first electrodes 710 may be separated from each other. The first electrode 710 may be connected to the drain electrode 177 through the electrode contact hole 182 of the planarization layer 180.

In addition, a pixel defining film 190 that has an opening that exposes the first electrode 710 may be formed on the planarization layer 180. That is, the pixel defining film 190 may have a plurality of openings that are formed for each pixel. In addition, the first electrode 710 may be disposed so as to correspond to the opening of the pixel defining film 190. However, the first electrode 710 is not necessarily disposed on only the pixel defining film 190, but a portion of the first electrode 710 may be disposed under the pixel defining film 190 so as to overlap the pixel defining film 190. The pixel defining film 190 may be made of resin, e.g., polyacrylate resin and/or polyimide, or silica-based inorganic materials.

An organic emission layer 720 may be formed On the first electrode 710. The second electrode 730 may be formed on the organic emission layer 720. As described above, the organic light emitting diode 70 may thus include the first electrode 710, organic emission layer 720, and the second electrode 730.

The organic emission layer 720 may be formed of, e.g., a low molecular weight organic material or a high molecular weight organic material. In an implementation, the organic emission layer 720 may have a multilayer structure including an emission layer, a hole injection layer (HIL), a hole transport layer (HTL), an electron transport layer (ETL), and an electron injection layer (EIL). When all of these layers are included, the hole injection layer (HIL) may be disposed on the first electrode 710 that is the anode, the hole transport layer (HTL), the emission layer, the electron transport layer (ETL), and the electron injection layer (EIL) may then be sequentially layered thereon.

In FIG. 3, the organic emission layer 720 is disposed only in the opening of the pixel defining film 190, but the embodiments are not limited thereto. Accordingly, the organic emission layer 720 may be formed on the first electrode 710 in the opening of the pixel defining film 190 and may be disposed between the pixel defining film 190 and the second electrode 730. In detail, the organic emission layer 720 may further include the emission layer, the hole injection layer (HIL), the hole transport layer (HTL), the electron transport layer (ETL) and the electron injection layer (EIL). The hole injection layer (HIL), the hole transport layer (HTL), the electron transport layer (ETL), and the electron injection layer (EIL), except for the emission layer, may be formed on the first electrode 710 and the pixel defining film 190 like the second electrode 730 by using the open mask. That is, among various films that constitute the organic emission layer 720, at least one of films may be disposed between the pixel defining film 190 and the second electrode 730.

The first electrode 710 and the second electrode 730 may be formed of, e.g., a transparent conductive material or semitransparent or reflective conductive material. According to the kind of the material that forms the first electrode 710 and the second electrode 730, the organic light emitting diode (OLED) display 100 may be a front surface light emitting type, a rear surface light emitting type or a both surface light emitting type.

The transparent conductive material may include, e.g., ITO (Indium Tin Oxide), IZO (Indium Zinc Oxide), ZnO (zinc oxide), and/or $In_2O_3$, (Indium Oxide). The reflective material and semitransparent material may include, e.g., lithium (Li), calcium (Ca), lithium fluoride/calcium (LiF/Ca), lithium fluoride/aluminum (LiF/Al), aluminum (Al), silver (Ag), magnesium (Mg), and/or gold (Au).

The sealing member 210 may face the display substrate 110 on the second electrode 730. The sealing member 210 may be made of a transparent material, e.g., glass and/or plastic. The sealing member 210 may be cohered or adhered with the display substrate 110 by way of the sealant 350 (shown in FIG. 1) along the edge and sealed.

Hereinafter, referring to FIGS. 4 and 5, an internal structure of the organic light emitting diode (OLED) display 100 will be described with respect to the conductive wire 179.

Figure 4:
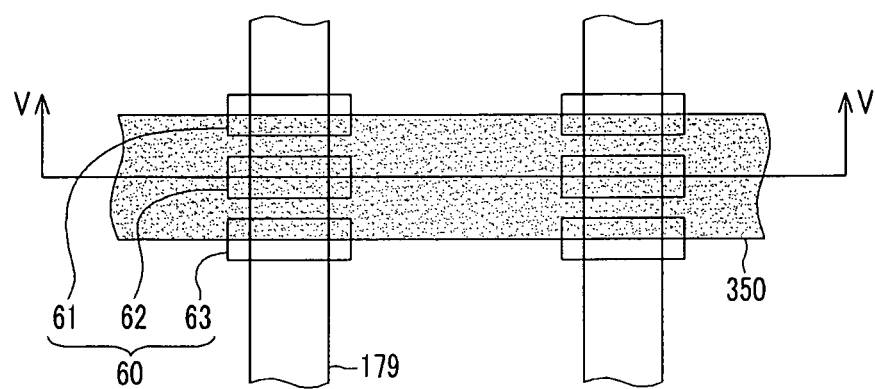
FIG. 4 illustrates an enlarged view of a portion A of the organic light emitting diode (OLED) display of FIG. 1.

FIG. 4 illustrates an enlarged view of a portion A of the organic light emitting diode (OLED) display of FIG. 1. FIG. 5 illustrates a cross-sectional view taken along the line V-V of FIG. 4.

Figure 5:
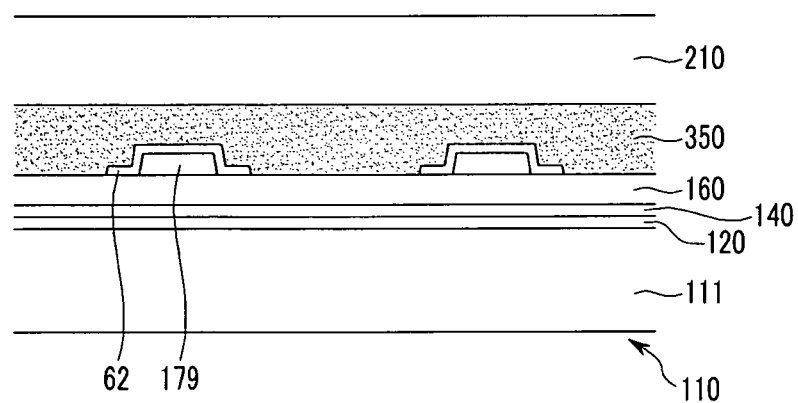
FIG. 5 illustrates a cross-sectional view taken along the line V-V of FIG. 4.

As shown in FIG. 4 and FIG. 5, the buffer layer 120 may be formed on the display substrate 111. The gate insulating layer 140 may be formed on the buffer layer 120. In addition, the interlayer insulating layer 160 may be formed on the gate insulating layer 140. A plurality of conductive wires 179 may be formed On the interlayer insulating layer 160. The sealant 350 may be formed on the conductive wire 179 while overlapping the conductive wire 179.

The conductive wire 179 may be formed through the same manufacturing process by using the same material as the switching source electrode 173 and switching drain electrode 174 of the switching thin film transistor 10 in the display area (DA) and the driving source electrode 176 and the driving drain electrode 177 of the driving thin film transistor 20. The conductive wire 179 may include at least one of, e.g., aluminum (Al), chromium (Cr), molybdenum (Mo), titanium (Ti), tantalum (Ta), Al—Ni—La alloy, and Al—Nd alloy.

A heat blocking film 60 that covers the conductive wire 179 may be formed between the conductive wire 179 and the sealant 350. The heat blocking film 60 may cover the conductive wire 179 and may include a plurality of sub-heat blocking films 61, 62, and 63 that are separated from one another at a predetermined interval. The sub-heat blocking films 61, 62, and 63 may have a triple film structure including, e.g., silver (Ag) or ITO/Ag/ITO.

As described above, since a plurality of sub-heat blocking films 61, 62, and 63 may be formed of the material that is resistant to heat, it is possible to prevent spreading or melting of the conductive wire 179 that is sensitive to heat during irradiation with the laser. Therefore, the conductive wire 179 that overlaps the sealant 350 may not be melted, thus preventing a short-circuit between the conductive wires. In addition, if portions of the conductive pattern 60 are corroded by heat and/or external moisture that are generated when an electric current is continuously supplied to the conductive wire 179, since the heat blocking film 60 may be divided into a plurality of sub-heat blocking films 61, 62, and 63, the sub-heat blocking film 62 that is not directly exposed to the external moisture may not be corroded. Therefore, it is possible to efficiently suppress the moisture from permeating to and/or through the sealant 350.

The sealing member 210 may be attached to an upper side of the sealant 350. The sealant 350 may be made of a ceramic-based material. For example, the sealant 350 may be a fit. In detail, one side of the sealant 350 may contact the sealing member 210 and another side may contact the interlayer insulating layer 160 where the conductive wire 179 and the heat blocking film 60 are not formed. Thus, the sealant 350 may cohere or adhere the sealing member 210 and the display substrate 110 and may seal them.

In the present embodiment, a short circuit between the conductive wires may be prevented by using a plurality of sub-heat blocking films 61, 62, and 63 that overlap the conductive wire 179.

Hereinafter, referring to FIGS. 6 and 7, an OLED display according to another embodiment including a plurality of short circuit blocking films will be described.

Figure 6:
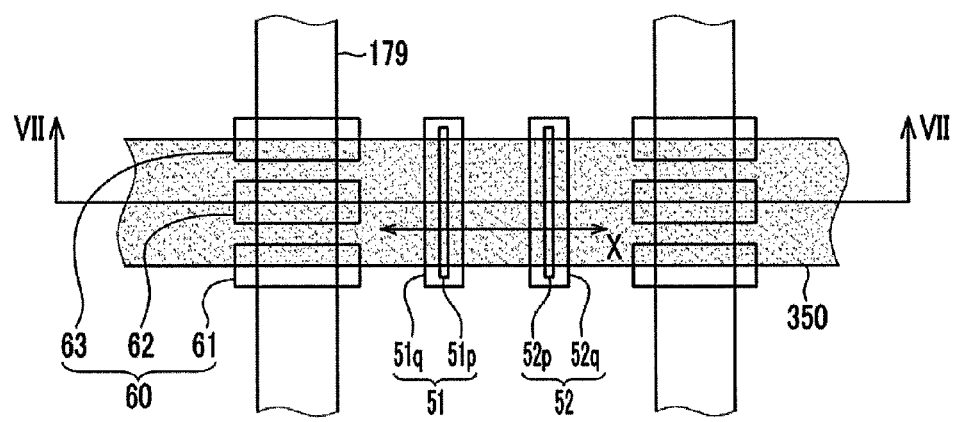
FIG. 6 illustrates an enlarged view of a portion of an organic light emitting diode (OLED) display according to another embodiment.

FIG. 6 illustrates an enlarged view of a portion of the organic light emitting diode (OLED) display according to another embodiment. FIG. 7 illustrates a cross-sectional view taken along the line VII-VII of FIG. 6. As described below, the display according to the present embodiment may include a plurality of short circuit blocking films 51 and 52 between the conductive wires 179.

Figure 7:
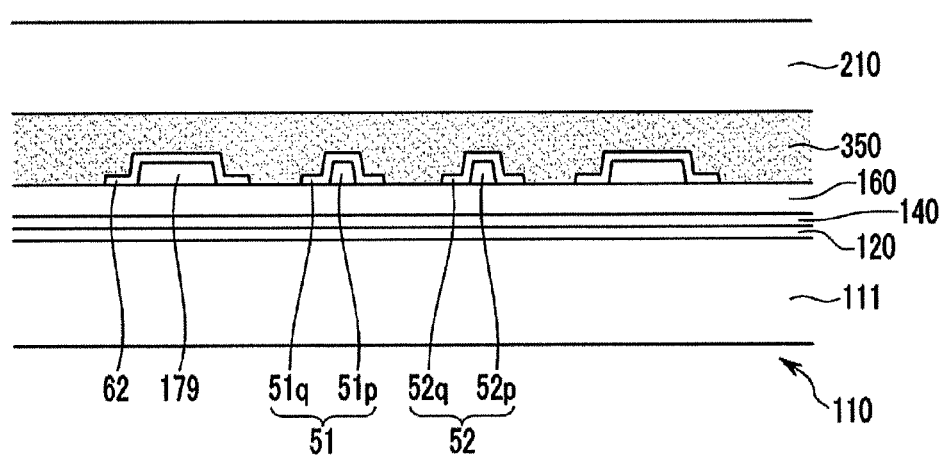
FIG. 7 illustrates a cross-sectional view taken along the line VII-VII of FIG. 6.

As shown in FIGS. 6 and 7, in the organic light emitting diode (OLED) display 100 according to the present embodiment, a plurality of short circuit blocking films 51 and 52 may be formed between the conductive wire 179 along a length direction X of the sealant 350. Hereinafter, the plurality of short circuit blocking films 51 and 52 will be described in terms of elements of the short circuit blocking film 51. Analogous elements in the short circuit blocking film 52 are designated with analogous reference characters.

The short circuit blocking film 51 may be formed between the conductive wires 179 and may have a planar rectangular shape. In an implementation, the short circuit blocking film 51 may have a double film structure that includes a lower blocking film 51$p$, and an upper blocking film 51$q$. The upper blocking film 51$q$ may completely cover the lower blocking film 51p. In another implementation, the short circuit blocking film 51 may have a single film structure. The short circuit blocking film having the single film structure may be formed of the same material as the first electrode.

In the short circuit blocking film 51 having the double film structure, the lower blocking film 51p, may be formed through the same manufacturing process by using the same material as the conductive wire 179, and the upper blocking film 51q may be formed through the same manufacturing process by using the same material as the first electrode 710.

During curing of the sealant 350 by irradiating a laser thereon, if the conductive wire 179 that overlaps the sealant 350 is melted, the conductive wires in the short circuit blocking film 51 between the conductive wire 179 may be prevented from being melted and attached or electrically connected. As described above, the short circuit blocking film 51 may have the double film structure of the lower blocking film 51p, and upper blocking film 51q,, and the melted conductive wires 179 may be efficiently prevented from electrically contacting each other over the short circuit blocking film 51.

In the present embodiment, a short circuit between the conductive wires may be prevented by using a plurality of short circuit blocking films 51 and 52 between the conductive wires 179 along the length direction X of the sealant 350.

Hereinafter, referring to FIG. 8, an OLED display according to yet another embodiment including a plurality of short circuit blocking films will be described.

Figure 8:
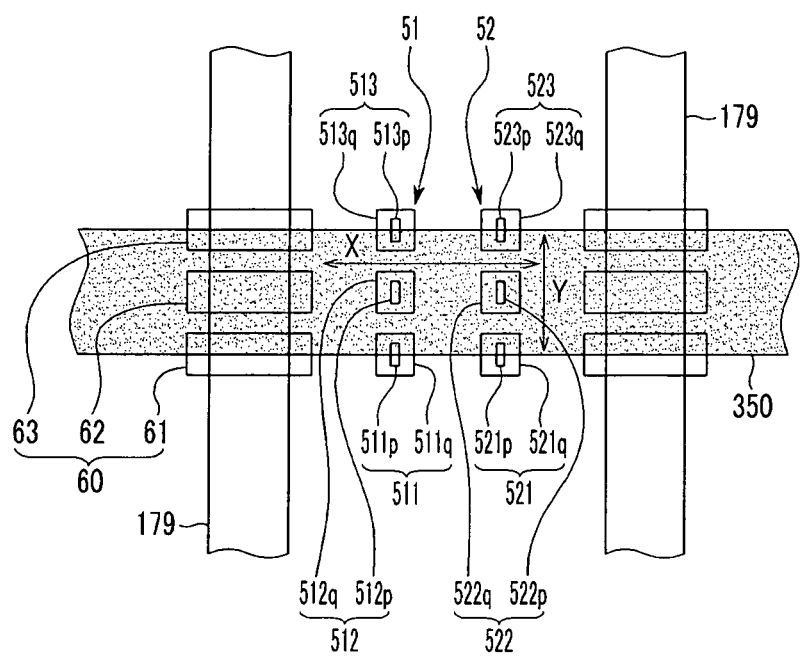
FIG. 8 illustrates an enlarged view of a portion of an organic light emitting diode (OLED) display according to yet another embodiment.

FIG. 8 illustrates an enlarged view of a portion of the organic light emitting diode (OLED) display according to yet another embodiment. As described below, the display of the present embodiment may include a plurality of short circuit blocking films 51 and 52 divided into a plurality of sub-short circuit blocking films 511, 512, 513, 521, 522, 523 along the width direction Y of the sealant 350.

As shown in FIG. 8, in the organic light emitting diode (OLED) display 100 according to the present embodiment, a plurality of short circuit blocking films 51 and 52 may be formed between the conductive wire 179 along a length direction X of the sealant 350. Each short circuit blocking film 51 and 52 may be separated from each other at a predetermined interval along the X direction of the sealant.

In addition, each short circuit blocking film 51 and 52 may be divided into a plurality of sub-short circuit blocking films 511, 512, 513, 521, 522, 523 along a width direction Y of the sealant 350.

The sub-short circuit blocking films 511, 512, 513, 521, 522, 523 may have a planar quadrangle shape. The sub-short circuit blocking films 511, 512, 513, 521, 522, 523 may be separated from each other at a predetermined interval. As described above, by dividing the short circuit blocking films 51 and 52 into a plurality of sub-short circuit blocking films 511, 512, 513, 521, 522, 523 to widen a contact area between the conductive wire 179 that may be melted by irradiation of the laser, melted portions of the conductive wire 179 may be effectively prevented from electrically contacting each other over the short circuit blocking films 51 and 52, i.e., a short circuit may be prevented.

Each sub-short circuit blocking film 511, 512, 513, 521, 522, and 523 may include the lower blocking film 511p,, 512p,, 513p,, 521p,, 522p,, and 523p, and upper blocking film 512q,, 512q,, 513q,, 521q,, 522q,, and 523q. The upper blocking film 512q,, 512q,, 513q,, 521q,, 522q,, 523q, may completely cover the lower blocking film 511p,, 512p,, 513p,, 521p,, 522p,, 523p.

When the conductive wire is covered by the heat blocking film including the material that is resistant to heat according to an embodiment, melting of the conductive wire that is sensitive to heat by the irradiation of the laser may be suppressed. In addition, even if a portion of the heat blocking film at edges of the sealant is exposed to heat and external moisture that are generated when an electric current is continuously provided to the conductive wire and the heat blocking film may be rapidly corroded, moisture still may not permeate a lower portion of the sealant due to the sub-heat blocking film structures. That is, damage to the sealant may be avoided and moisture may be blocked from entering the display from the outside.

According to an embodiment, by forming a heat blocking film including the plurality of sub-heat blocking films between the conductive wire and the sealant in the organic light emitting diode (OLED) display, when the laser is irradiated to the sealant, the conductive wire that overlaps the sealant may not be melted, thereby preventing a short circuit between the conductive wires.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A display, comprising:
   a display substrate;
   a sealing member facing the display substrate;
   a sealant between the display substrate and the sealing member, the sealant cohering the display substrate and the sealing member;
   a conductive wire on the display substrate and overlapping the sealant; and
   at least two sub-heat blocking films directly contacting and on the conductive wire and between the conductive wire and the sealant,
      wherein the at least two sub-heat blocking films are spaced apart along a width direction of the sealant, each of the at least two sub-heat blocking films directly contacting the conductive wire,
      wherein the sealant contacts the at least two sub-heat blocking films, and
      wherein each of the at least two sub-heat blocking films covers an upper surface and two side surfaces of the conductive wire.

2. The display as claimed in claim 1, wherein each of the at least two sub-heat blocking films has a triple film structure, the triple film structure including silver (Ag) or ITO/Ag/ITO.

3. The display as claimed in claim 1, further comprising:
   a plurality of conductive wires; and
   at least one short circuit blocking film between the plurality of conductive wires.

4. The display as claimed in claim 3, wherein the at least one short circuit blocking film overlaps the sealant.

5. The display as claimed in claim 3, wherein the at least one short circuit blocking film includes a plurality of short circuit blocking films disposed along a length direction of the sealant.

6. The display as claimed in claim 5, wherein each short circuit blocking film of the plurality of short circuit blocking films has a planar rectangular shape.

7. The display as claimed in claim 5, wherein each short circuit blocking film of the plurality of short circuit blocking films includes a plurality of sub-short circuit blocking films spaced apart from one another along the width direction of the sealant.

8. The display as claimed in claim 7, wherein each sub-short circuit blocking film of the plurality of sub-short circuit blocking films have a planar quadrangle shape.

9. The display as claimed in claim 3, further comprising:
a thin film transistor in a display area of the display substrate, and
a driving circuit chip at an edge of the display substrate, the driving circuit chip transferring a driving signal to the thin film transistor,
wherein at least one of the plurality of conductive wires electrically connects the thin film transistor and the driving circuit chip.

10. The display as claimed in claim 9, further comprising an organic light emitting diode, the organic light emitting diode including a first electrode on the thin film transistor, an organic emission layer on the first electrode, and a second electrode on the organic emission layer.

11. The display as claimed in claim 10, wherein the at least one short circuit blocking film has a double film structure that includes a lower blocking film and an upper blocking film.

12. The display as claimed in claim 11, wherein the upper blocking film covers the lower blocking film.

13. The display as claimed in claim 12, wherein the plurality of conductive wires includes at least one of aluminum (Al), chromium (Cr), molybdenum (Mo), titanium (Ti), tantalum (Ta), Al—Ni—La alloy, and Al—Nd alloy.

14. The display as claimed in claim 12, wherein the lower blocking film is formed of a same material as the plurality of conductive wires.

15. The display as claimed in claim 11, wherein:
the at least one short circuit blocking film includes at least two short circuit blocking films between adjacent pairs of conductive wires of the plurality of conductive wires, and
the upper blocking film is formed of the same material as the first electrode.

16. The display as claimed in claim 10, wherein the at least one short circuit blocking film has a single film structure.

17. The display as claimed in claim 16, wherein:
the at least one short circuit blocking film includes at least two short circuit blocking films between adjacent pairs of conductive wires of the plurality of conductive wires, and
the at least two single film short circuit blocking films are formed of the same material as the first electrode.

* * * * *